United States Patent
Li et al.

(10) Patent No.: US 11,587,955 B2
(45) Date of Patent: Feb. 21, 2023

(54) TFT BACKPLANE AND MICRO-LED DISPLAY

(71) Applicant: SHENZHEN CHINA STAR OPTOELECTRONICS SEMICONDUCTOR DISPLAY TECHNOLOGY CO., LTD, Shenzhen (CN)

(72) Inventors: Gongtan Li, Shenzhen (CN); Hyunsik Seo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 226 days.

(21) Appl. No.: 16/615,158

(22) PCT Filed: Sep. 9, 2019

(86) PCT No.: PCT/CN2019/104902
§ 371 (c)(1),
(2) Date: Nov. 20, 2019

(87) PCT Pub. No.: WO2021/012359
PCT Pub. Date: Jan. 28, 2021

(65) Prior Publication Data
US 2021/0327906 A1 Oct. 21, 2021

(30) Foreign Application Priority Data

Jul. 24, 2019 (CN) .......................... 201910671374.9

(51) Int. Cl.
*H01L 27/12* (2006.01)
*H01L 25/16* (2023.01)
*H01L 29/786* (2006.01)

(52) U.S. Cl.
CPC .......... *H01L 27/124* (2013.01); *H01L 25/167* (2013.01); *H01L 29/78633* (2013.01)

(58) Field of Classification Search
CPC ................ H01L 27/124; H01L 25/167; H01L 29/78633
See application file for complete search history.

(56) References Cited

U.S. PATENT DOCUMENTS 6,927,809 B2 * 8/2005 Gotoh ............... H01L 29/78633
349/44
7,211,825 B2 * 5/2007 Shih .................. H01L 29/78633
257/13

(Continued)

*Primary Examiner* — Eugene Lee
(74) *Attorney, Agent, or Firm* — PV IP PC; Wei Te Chung; Ude Lu

(57) ABSTRACT

A TFT backplane and a micro-LED display are provided A metal light shielding layer is placed at the lower surface of the substrate and the position of the metal light shield layer is corresponding to the active layer. This reduces the size of the side frame, which is used when assembling multiple displays in a large-size micro LED display application. This could meet the demand of large-size micro-LED display. In addition, this could further reduce the steps of depositing and patterning a conventional shield metal layer in a convention process of manufacturing the TFT. Therefore, the manufacturing steps of the TFT backplane are simplified and thus the manufacturing cost is reduced.

19 Claims, 3 Drawing Sheets

(56) References Cited

U.S. PATENT DOCUMENTS

| | | | | |
|---|---|---|---|---|
| 7,646,440 B2* | 1/2010 | Cheng | ................ | H01L 27/124 |
| | | | | 349/39 |
| 8,450,619 B2* | 5/2013 | Arvin | ................ | C23C 18/1653 |
| | | | | 174/257 |
| 8,592,310 B2* | 11/2013 | Park | ................ | H01L 21/76898 |
| | | | | 257/E23.024 |
| 8,592,988 B2* | 11/2013 | Lee | ................ | H01L 21/76898 |
| | | | | 257/773 |
| 9,123,789 B2* | 9/2015 | Lin | ................ | H01L 21/76898 |
| 9,449,906 B2* | 9/2016 | Kirby | ................ | H01L 23/49811 |
| 9,761,650 B2* | 9/2017 | Kwon | ................ | H01L 29/78633 |
| 10,224,280 B2* | 3/2019 | Gambino | ............ | H01L 23/5226 |
| 2015/0021081 A1* | 1/2015 | Mitarai | ................ | H05K 1/115 |
| | | | | 174/260 |
| 2016/0126258 A1* | 5/2016 | Liu | ................ | H01L 27/1222 |
| | | | | 257/72 |
| 2019/0214504 A1* | 7/2019 | Song | ................ | H01L 27/1218 |
| 2020/0127073 A1* | 4/2020 | Ke | ................ | H01L 27/3276 |
| 2020/0161244 A1* | 5/2020 | Kao | ................ | H01L 21/76832 |

* cited by examiner

TFT BACKPLANE AND MICRO-LED DISPLAY

FIELD OF THE INVENTION

The present disclosure relates to display field, and more particularly to a thin film transistor (TFT) backplane used in a large size micro-light emitting diode (micro-LED) display and the related micro-LED display.

BACKGROUND

Micro-LED technique, namely the LED minimizing and matrix technique, represents a high-density micro-sized LED matrix integrated in a chip. For example, each pixel of the LED display panel can be addressable and be individually lightened. The distance between the pixels can be reduced to the nanometer level instead of micron level. Furthermore, an important application of the micro-LED is a super large size display.

Currently, the backplane of the micro-LED display is made by top gate LTPS TFTs. However, the LTPS TFTs could only be manufactured in 6th generation production line (where the glass size is 1.5 meter*1.85 meter). The glass size is comparably small and may face some difficulties if a super large size display is required.

Further, in a large size micro-LED application, an assembly technique is often used to combine multiple display panels together. However, the edge area of an ordinary display panel is used for electrical lines to connect to driving chips and often has a dimension between 3 to 50 mms. Therefore, when multiple display panels are assembled, there will be black lines between the display panels and thus the visual effect is affected.

Therefore, the side frame should be narrowed to reduce the manufacturing steps for manufacturing the TFT backplane. This becomes a technical issue in the micro-LED display field.

SUMMARY

One objective of an embodiment of the present disclosure is to provide a TFT backplane and related micro-LED display to meet the demands of large-size micro-LED and reduce the size of the side frame and the manufacturing steps for manufacturing the TFT backplane.

According to an embodiment of the present disclosure, a thin film transistor (TFT) backplane is disclosed. The TFT backplane comprises: a substrate; at least one thin film transistor (TFT), positioned above the substrate, the TFT comprising an active layer; at least one metal light shielding layer, positioned on a lower surface of the substrate corresponding to the active layer, configured to perform a light shielding for the active layer, wherein a length of the metal light shielding layer is longer than a length of a trench region of the active layer, a width of the metal light shielding layer is longer than a width of the trench region of the active layer, and the trench region of active layer is aligned with a center of the metal light shielding layer; a back insulating layer, positioned at the lower surface of the substrate and covering the metal light shielding layer and the lower surface of the substrate; and a metal line layer, positioned at a side of the substrate and under the metal light shielding layer, configured to connect to an external driving chip, wherein the metal line layer is positioned at the side of the substrate and a lower surface of the back insulating layer and contacts the metal light shielding layer through a via on the back insulating layer.

According to an embodiment of the present disclosure, a thin film transistor (TFT) backplane is disclosed. The TFT backplane comprises: a substrate; at least one thin film transistor (TFT), positioned above the substrate, the TFT comprising an active layer; at least one metal light shielding layer, positioned at a location of a lower surface of the substrate corresponding to the active layer, configured to perform a light shielding for the active layer; and a metal line layer, positioned at a side of the substrate and under the metal light shielding layer, configured to connect to an external driving chip.

According to an embodiment of the present disclosure, a micro-LED display, comprising a TFT back plane. The TFT back plane comprises: a substrate; at least one thin film transistor (TFT), positioned above the substrate, the TFT comprising an active layer; at least one metal light shielding layer, positioned at a location of a lower surface of the substrate corresponding to the active layer, configured to perform a light shielding for the active layer; and a back insulating layer, positioned at the lower surface of the substrate and covering the metal light shielding layer and the lower surface of the substrate; and a metal line layer, positioned at a side of the substrate and under the metal light shielding layer, configured to connect to an external driving chip; wherein a length of the metal light shielding layer is longer than a length of a trench region of the active layer, a width of the metal light shielding layer is longer than a width of the trench region of the active layer, and the trench region of active layer is aligned with a center of the metal light shielding layer.

In contrast to the conventional art, an embodiment of the present disclosure positions a metal line layer at a side of the substrate and under the substrate for connecting to the driving chip. This reduces the size of the side frame, which is used when assembling multiple displays in a large-size micro LED display application. Furthermore, a metal light shielding layer is positioned at the lower surface of the substrate and the position of the metal light shielding layer is corresponding to the position of the active layer. This could further reduce the steps of depositing and patterning a conventional shield metal layer in a convention process of manufacturing the TFT. Therefore, the manufacturing steps of the TFT backplane are simplified and thus the manufacturing cost is reduced.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

Figure 1A:
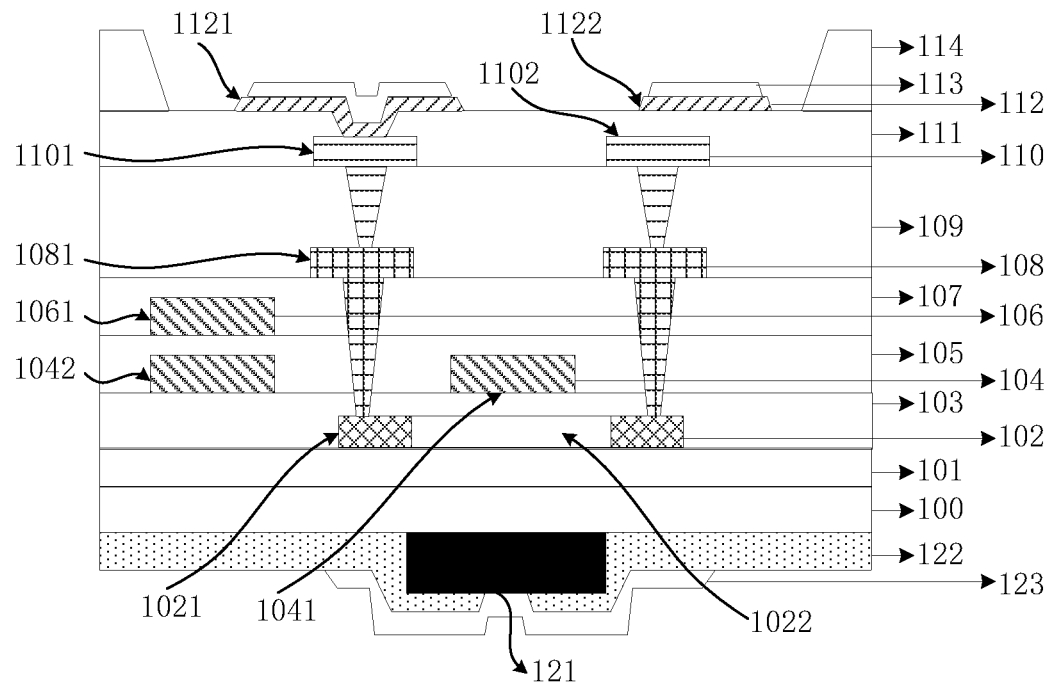
FIG. 1A is a diagram of a layer structure of a TFT backplane according to a first embodiment of the present disclosure.

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. Besides, the first characteristic arranged on/above/over the second characteristic implies that the first characteristic arranged right above/obliquely above or merely means that the level of the first characteristic is higher than the level of the second characteristic. The first characteristic arranged under/below/beneath the second characteristic implies that the first characteristic arranged right under/obliquely under or merely means that the level of the first characteristic is lower than the level of the second characteristic.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement. The methods proposed by the present disclosure provide a variety of examples with a variety of processes and materials. However, persons skilled in the art understand ordinarily that the application of other processes and/or the use of other kinds of materials are possible.

A TFT backplane is provided for the large-size micro-LED display application. The TFT backplane includes a substrate, at least one thin film transistor (TFT) positioned above the substrate, at least one metal light shielding layer positioned at a location of a lower surface of the substrate corresponding to the active layer, and a metal line layer positioned at a side of the substrate and under the metal light shielding layer, configured to connect to an external driving chip. The TFT includes an active layer. The metal light shielding layer is configured to perform a light shielding for the active layer.

Optionally, the TFT is a top gate oxide TFT, or a top gate low temperature poly-silicon (LTPS) TFT is manufactured through a top gate low temperature poly-silicon technique.

Optionally, the TFT comprises a single-layer source/drain metal layer or a multi-layer source/drain metal layer.

Optionally, the TFT backplane further comprises a gate insulating layer and a gate metal layer sequentially positioned at a surface of the active layer, wherein the gate metal layer constitute as a gate of the TFT, a dielectric layer covering the substrate, the active layer, the gate insulating layer and the gate metal layer, and a source/drain metal layer, positioned above the dielectric layer, constituting as a source/drain of the TFT, the source/drain of the TFT contacts a source/drain contact region through a via.

By adopting the TFT backplane of the present application, the driving chips can be positioned on the back of the backplane to reduce the size of the side frame of the display panel. The side frame, which is used when assembling multiple displays in a large-size micro LED display application, is reduced such that the demands of large-size micro LED displays are met. Furthermore, a metal light shielding layer can be used as a conventional shield metal layer. Therefore, the TFT backplane of an embodiment does not require the shield metal layer. This could further reduce the steps of depositing and patterning a conventional shield metal layer in a convention process of manufacturing the TFT. Therefore, the manufacturing steps of the TFT backplane are simplified and thus the manufacturing cost is reduced.

Figure 1B:
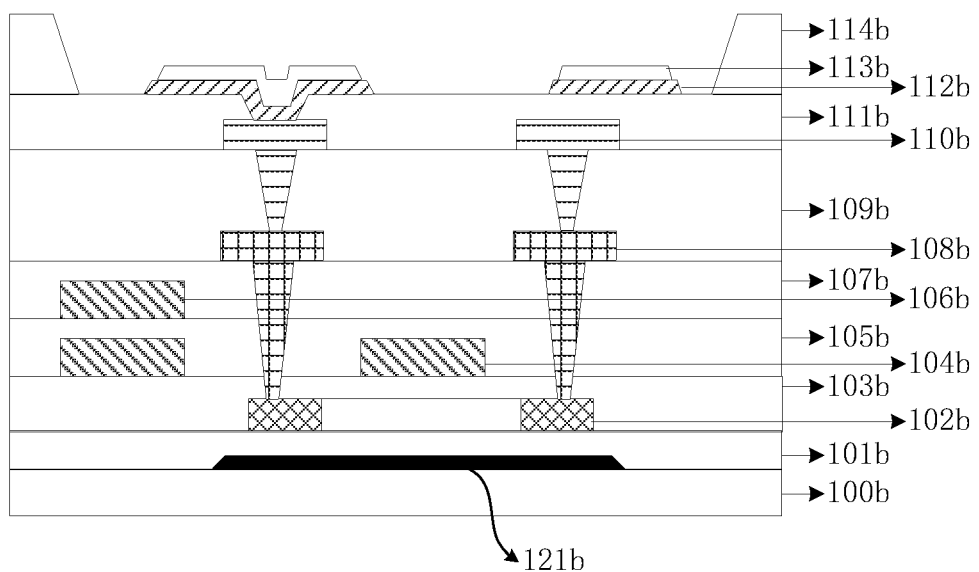
FIG. 1B is a diagram of a layer structure of a conventional TFT matrix substrate.

Please refer to FIG. 1A and FIG. 1B. FIG. 1A is a diagram of a layer structure of a TFT backplane according to a first embodiment of the present disclosure. FIG. 1B is a diagram of a layer structure of a conventional TFT matrix substrate.

As shown in FIG. 1A, the TFT backplane comprises: a substrate 100, at least one TFT positioned above the substrate (its structure will be illustrated in details in the following disclosure), the TFT comprises an active layer 102. The active layer 102 comprises a trench region 1022. The TFT backplane further comprises at least one metal light shielding layer 121, positioned at a location of a lower surface of the substrate corresponding to the location of the active layer 102, configured to perform a light shielding for the active layer; a back insulating layer 122, positioned at the lower surface of the metal light shielding layer 121 and covering the metal light shielding layer and the lower surface of the substrate 100; and a metal line layer 123, positioned at a side of the substrate and at the lower surface of the back insulating layer 122 and contacting the metal light shielding layer 121 through a via formed on the back insulating layer 122, configured to connect to an external driving chip. That is, at the time the metal line layer 123 is being manufactured at the back of the substrate, the metal light shielding layer 121 is also formed. The metal light shielding layer 121 can work as a conventional shield metal layer of the TFT. This could further reduce the steps of depositing and patterning a conventional shield metal layer in a convention process of manufacturing the TFT. Therefore, the manufacturing steps of the TFT backplane are simplified and thus the manufacturing cost is reduced.

The material of the metal light shielding layer 121 could be a metal having a light shielding function, such as a composite layer of IZO and CuCa, or any other materials having a light shielding function. Optimally, the length of the metal light shielding layer 121 is longer than the length of the trench region 1022 of the active layer 102, the width of the metal light shielding layer 121 is longer than the width of the trench region 1022 of the active layer 102, and the center of the trench region 1022 of active layer is aligned with the center of the metal light shielding layer 121. In this way, the ambient lights could be efficiently blocked such that the light shielding protection could be performed on the active layer 102.

The back insulating layer 122 can be a silicon oxide (SiOx) layer, a silicon nitride (SiNx) layer, or a silicon oxynitride (SiOxNy) layer. In this embodiment, the driving chip could be placed on the back of the backplane such that the side frame of the panel could be downsized. Optimally, the metal line layer 123 could be manufactured with ITO material.

In this embodiment, at the same time when the metal line layer is manufactured, the metal light shielding layer is formed at the lower surface of the substrate and the location of the metal light shielding layer is corresponding to the location of the active region to block the ambient lights. This could reduce the steps of depositing and patterning a conventional shield metal layer in a convention process of manufacturing the TFT. Therefore, the manufacturing steps of the TFT backplane are simplified and thus the manufacturing cost is reduced.

In this embodiment, the TFT is manufactured with LTPS technique. The LTPS technique utilizes deposition, lithography, and etching steps to form multiple films with different patterns and materials to form a LTPS driving circuit to provide a stable power and lightening signal to the lighting device.

The metal line layer 123 is used to connect to an external driving chip to transfer the driving signal from the external driving chip to the display region.

Further, a buffer 101 is formed between the substrate 100 and the active layer 102.

The TFT backplane comprises: a substrate 100; an active layer 102 formed on the substrate 100 (or the buffer layer 101); a first gate insulating layer (GI1) 103 formed on the active layer 102 and covering the active layer 102 and the substrate 100 (or the buffer layer 101); a first gate metal layer (GE1) 104 formed on the first gate insulating layer 103; a second gate insulating layer 104 formed on the first gate metal layer 104 and covering the first gate metal layer 104 and the first gate insulating layer 103; a second gate metal layer (GE2) 106 formed on the second gate insulating layer 105; a dielectric insulting layer 107 formed on the second gate metal layer 106 and covering the second gate metal layer 106 and the second gate insulating layer 105; a first source/drain metal layer (S/D1) 108 formed on the dielectric insulating layer 107; and a first passivation layer (VIA1) 109 formed on the first source/drain metal layer 108 and covering the first source/drain metal layer 108 and the dielectric insulating layer 107.

The first gate metal layer 104 comprises a patterned gate 1041 and a first plate 1042 of the capacitor of the TFT backplane. The second gate metal layer 106 comprises a second plate 1061 of the aforementioned capacitor. The active layer 102 comprises the trench region 1022 corresponding to the gate 1041 and the source/drain contact region 1021 at two sides of the trench region 1022. The first source/drain metal layer 108 comprises patterned source/drain 1081. The source/drain 1081 contacts the source/drain contact region 1021 through the via. The active layer 102, the gate 1041, the source/drain 1081 constitute the TFT of the TFT backplane.

The TFT backplane further comprises: a second source/drain metal layer (S/D2) 110 formed on the first passivation layer 109; a second passivation layer (VIA2) 111 formed on the second source/drain metal layer 110 and covering the source/drain metal layer 110; a third source/drain metal layer (S/D3) 112 formed on the second passivation layer 111; a first transparent conductive layer (ITO1) 113 formed on the third source/drain metal layer 112. The second source/drain metal layer 110 comprises an electrode connection line 1101 and a first driving power line 1102. The electrode connection line 1101 and the first driving power line 1102 are respectively electrically connected to the source/drain 1081 through corresponding vias. The third source/drain metal layer 112 comprises a patterned anode 1121 and a second driving power line 1122. The anode 1121 is connected to the electrode connection line 1101 through the via. The first transparent conductive layer 112 is used as a pixel electrode. In this embodiment, the first driving power line 1102 is used to provide a voltage driving signal (VDD). The second driving power line 112 is used to provide a power on/off signal (VSS).

In this embodiment, a third passivation layer (VIA3) 114 is formed on the second passivation layer 111. Through etching the third passivation layer 115, the anode 1121 and the second driving power line 1122 are exposed.

In this embodiment, the TFT backplane adopts three source/drain layers. However, this is not the limitation of the present disclosure. In the actual implementation, one source/drain layer or two or more source/drain layers could be adopted in the TFT backplane according to the LTPS technique. That is, a metal light shielding layer could be placed on the back of the backplane according to the corresponding position of the active layer.

The substrate 100 is a flexible substrate manufactured with a glass substrate or a high molecular polymer. The high molecular polymer can be polyimide (PI).

The buffer layer 213 can be a silicon oxide layer, a silicon nitride layer, or a composite layer of the silicon oxide layer and a silicon nitride layer.

The first passivation layer (VIA1) 107, the second passivation layer (VIA2) 109 and the third passivation layer (VIA3) 113 can be manufactured with the same material.

In contrast, as shown in FIG. 1B, a conventional TFT matrix substrate comprises stacked positioned a substrate 100b, a shield metal layer 121b, a buffer layer 101b, an active layer 102b, a first gate insulating layer (GI1) 103b, a first gate metal layer (GE1) 104b, a second gate insulating layer (GI2) 105b, a second gate metal layer (GE2) 106b, a dielectric insulating layer (ILD) 107b, a first source/drain metal layer (S/D1) 108b and a first passivation layer (VIA1) 109b. The backplane of the conventional TFT matrix substrate further comprises a second source/drain metal layer (S/D2) 110b, a second passivation layer (VIA2) 111b, a third source/drain metal layer (S/D3) 112b, a first transparent conductive layer (ITO1) 113b, and a third passivation layer (VIA3) 114b sequentially stacked positioned on the first passivation layer 109b. That is, in the conventional art, when the TFT is being manufactured, the deposition and patterning steps of the shield metal layer are required.

Figure 2A:
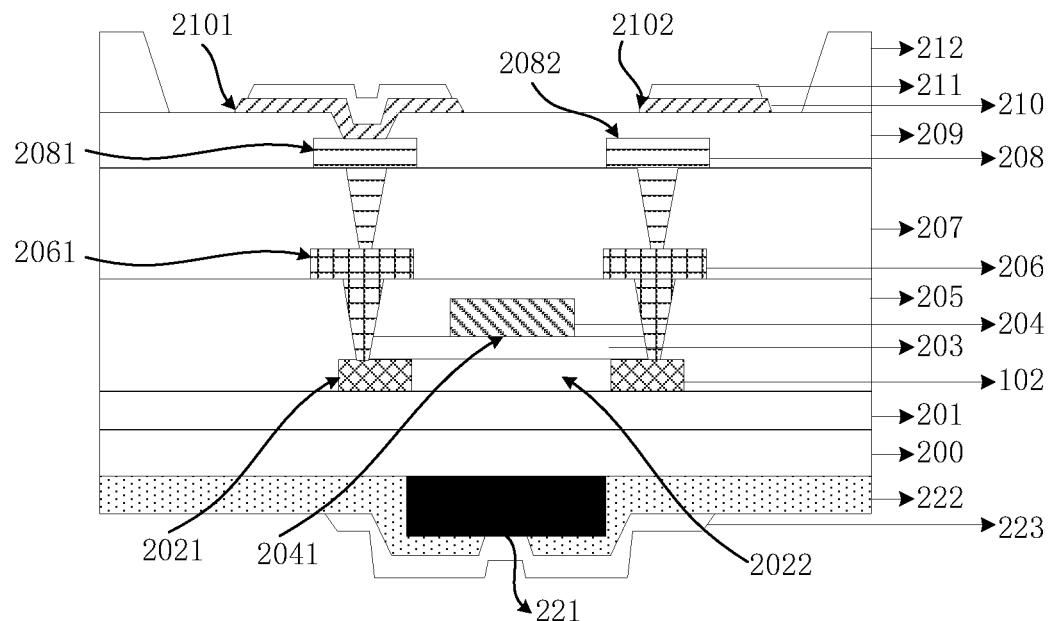
FIG. 2A is a diagram of a layer structure of a TFT backplane according to a second embodiment of the present disclosure.
Figure 2B:
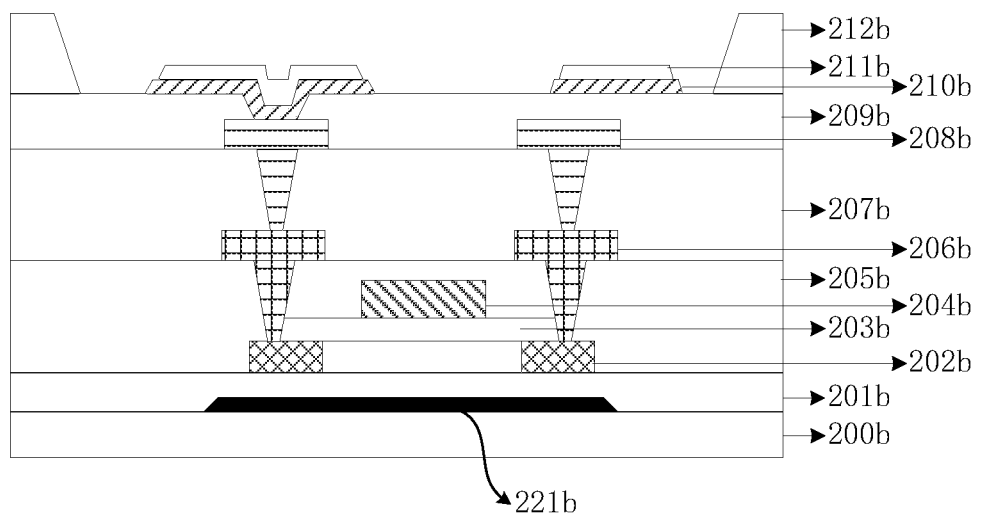
FIG. 2B is a diagram of a layer structure of another conventional TFT matrix substrate.

Please refer to FIG. 2A and FIG. 2B. FIG. 2A is a diagram of a layer structure of a TFT backplane according to a second embodiment of the present disclosure. FIG. 2B is a diagram of a layer structure of another conventional TFT matrix substrate. The difference between the embodiments shown in FIG. 1A and FIG. 2A is that the TFT in FIG. 2A is a top gate oxide TFT.

As shown in FIG. 2A, the TFT backplane comprises: a substrate 200; an active layer 202 formed on the substrate 200 (or the buffer layer 201); a first gate insulating layer (GI) 203 formed on the active layer 202; a first gate metal layer (GE) 204 formed on the first gate insulating layer 203; a dielectric insulating layer (ILD) 205 formed on the gate metal layer 204 and covering the gate metal layer 204, the gate insulating layer 203, the active layer 202 and the substrate 200 (or the buffer layer 201); a first source/drain metal layer (S/D1) 206 formed on the dielectric insulating layer 205; a first passivation layer 207 formed on the first source/drain metal layer 206 and covering the first source/drain metal layer 206 and the dielectric insulating layer 205.

The gate metal layer 204 comprises a patterned gate 2041. The active layer 202 comprises a trench region 2022 corresponding to the gate 2041 and a source/drain contact region 2021 positioned at two sides of the trench region. The first source/drain metal layer 206 comprises a patterned source/drain 2061. The source/drain 2061 contacts the source/drain contact region 2021 through the via. The active layer 202, the gate 2041, the source/drain 2061 constitute the TFT of the TFT backplane.

The TFT backplane further comprises: a second source/drain metal layer (S/D2) 208 formed on the first passivation layer 207; a second passivation layer (VIA2) 209 formed on the second source/drain metal layer 208 and covering the source/drain metal layer 208; a third source/drain metal layer (S/D3) 210 formed on the second passivation layer 209; and a first transparent conductive layer (ITO1) 211.

The second source/drain metal layer 208 comprises an electrode connection line 2081 and a first driving power line 2082. The electrode connection line 2081 and the first driving power line 2082 are respectively electrically connected to the source/drain 2061 through corresponding vias. The third source/drain metal layer 210 comprises a patterned anode 2101 and a second driving power line 2102. The anode 2101 is connected to the electrode connection line 2081 through the via. The first transparent conductive layer 211 is used as a pixel electrode. In this embodiment, the first driving power line 2082 is used to provide a voltage driving signal (VDD). The second driving power line 2102 is used to provide a power on/off signal (VSS). In another embodiment, the third source/drain metal layer 111 can comprises a cathode.

In this embodiment, a third passivation layer (VIA3) 212 is formed on the second passivation layer 209. Through etching the third passivation layer 212, the anode 2101 and the second driving power line 2102 are exposed.

In this embodiment, the TFT backplane adopts three source/drain layers. However, this is not the limitation of the present disclosure. In the actual implementation, one source/drain layer or two or more source/drain layers could be adopted in the TFT backplane according to the LTPS technique. That is, a metal light shielding layer could be placed on the back of the backplane according to the corresponding position of the active layer.

In this embodiment, the TFT backplane further comprises a metal light shielding layer 221, positioned at a location of a lower surface of the substrate corresponding to the location of the active layer 202, configured to perform a light shielding for the active layer; a back insulating layer 222, positioned at the lower surface of the metal light shielding layer 221 and covering the metal light shielding layer and the lower surface of the substrate 200; and a metal line layer 223, positioned at a side of the substrate 200 and at the lower surface of the back insulating layer 222 and contacting the metal light shielding layer 221 through a via formed on the back insulating layer 222, configured to connect to an external driving chip. That is, at the time the metal line layer 223 is being manufactured at the back of the substrate, the metal light shielding layer 221 is also formed. The metal light shielding layer 221 can work as a conventional shield metal layer of the TFT. This could further reduce the steps of depositing and patterning a conventional shield metal layer in a convention process of manufacturing the TFT. Therefore, the manufacturing steps of the TFT backplane are simplified and thus the manufacturing cost is reduced.

In contrast, as shown in FIG. 2B, a conventional TFT matrix substrate comprises stacked positioned a substrate 200b, a shield metal layer 221b, a buffer layer 201b, an active layer 202b, a first gate insulating layer (GI) 203b, a first gate metal layer (GE) 204b, a dielectric insulating layer (ILD) 205b, a first source/drain metal layer (S/D1) 206b and a first passivation layer (VIA1) 207b. The backplane of the conventional TFT matrix substrate further comprises a second source/drain metal layer (S/D2) 208b, a second passivation layer (VIA2) 209b, a third source/drain metal layer (S/D3) 210b, a first transparent conductive layer (ITO1) 211b, and a third passivation layer (VIA3) 212b sequentially stacked positioned on the first passivation layer 207b. That is, in the conventional art, when the TFT is being manufactured, the deposition and patterning steps of the shield metal layer are required.

Figure 3:
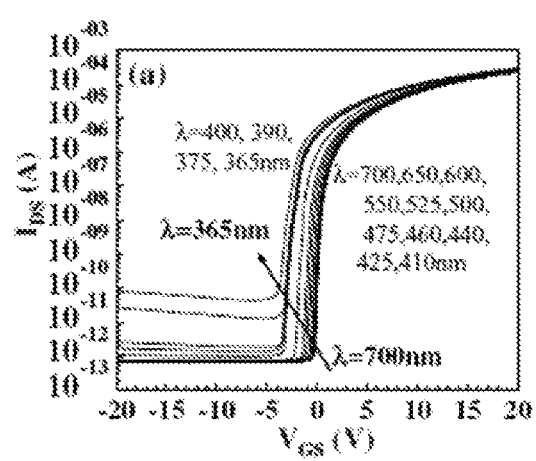
FIG. 3 is a diagram of influences on the characteristics of TFTs by lights having different wavelengths.

Please refer to FIG. 3. FIG. 3 is a diagram of influences on the characteristics of TFTs by lights having different wavelengths. As shown in FIG. 3, the x axis represents the gate voltage VGS (in Volts), the y axis represents the source/drain current IDS (in Amperes), and the curves represents the influences on the characteristics of TFTs by lights having different wavelengths ($\lambda$) from 365 nm to 700 nm. It can been seen that the lights having wavelengths ($\lambda$) from 365 nm to 700 nm can seriously influence the characteristics of the TFTs. Therefore, the metal light shielding layer is placed at the lower surface of the substrate and the position of the metal light shield layer is corresponding to the active layer. This could block the ambient lights for the active layer such that the TFT could have a better resistance on the ambient lights. In addition, this could further reduce the steps of depositing and patterning a conventional shield metal layer in a convention process of manufacturing the TFT. Therefore, the manufacturing steps of the TFT backplane are simplified and thus the manufacturing cost is reduced.

Furthermore, a micro-LED display is provided according an embodiment of the present disclosure. The micro-LED display comprises the above-mentioned TFT backplane. As previously mentioned, a metal light shielding layer is placed at the lower surface of the substrate and the position of the metal light shield layer is corresponding to the active layer. This reduces the size of the side frame, which is used when assembling multiple displays in a large-size micro LED display application. Therefore, this could meet the demand of large-size micro-LED display. In addition, this could further reduce the steps of depositing and patterning a conventional shield metal layer in a convention process of manufacturing the TFT. Therefore, the manufacturing steps of the TFT backplane are simplified and thus the manufacturing cost is reduced.

Above are embodiments of the present disclosure, which does not limit the scope of the present disclosure. Any modifications, equivalent replacements or improvements within the spirit and principles of the embodiment described above should be covered by the protected scope of the invention.

What is claimed is:

1. A thin film transistor (TFT) backplane, comprising:
    a substrate;
    a buffer layer, positioned above the substrate;
    at least one thin film transistor (TFT), positioned above the buffer layer, the TFT comprising an active layer;
    at least one metal light shielding layer, positioned on a lower surface of the substrate corresponding to the active layer, configured to perform a light shielding for the active layer, wherein a length of the metal light shielding layer is greater than a length of a channel region of the active layer, a width of the metal light shielding layer is wider than a width of the channel region of the active layer, and the channel region of active layer is aligned with a center of the metal light shielding layer;
a back insulating layer, positioned at the lower surface of the substrate and covering the metal light shielding layer and the lower surface of the substrate; and
a metal line layer, positioned at a side of the substrate and under the metal light shielding layer, configured to connect to an external driving chip, wherein the metal line layer is positioned at the side of the substrate and a lower surface of the back insulating layer and contacts the metal light shielding layer through a via on the back insulating layer.

2. The TFT backplane of claim 1, wherein the TFT is a top gate oxide TFT.

3. The TFT backplane of claim 1, wherein the TFT is manufactured through a top gate low temperature poly-silicon technique.

4. The TFT backplane of claim 1, wherein the TFT comprises a single-layer source/drain metal layer or a multi-layer source/drain metal layer.

5. The TFT backplane of claim 1, further comprising:
a gate insulating layer and a gate metal layer sequentially positioned at a surface of the active layer, wherein the gate metal layer constitute as a gate of the TFT;
a dielectric layer, covering the substrate, the active layer, the gate insulating layer and the gate metal layer;
a source/drain metal layer, positioned above the dielectric layer, constituting as a source/drain of the TFT, the source/drain of the TFT contacts a source/drain contact region through a via.

6. The TFT backplane of claim 1, further comprising:
a buffer layer, positioned between the active layer and the substrate.

7. A thin film transistor (TFT) backplane, comprising:
a substrate;
a buffer layer, positioned above the substrate;
at least one thin film transistor (TFT), positioned above the buffer layer, the TFT comprising an active layer;
at least one metal light shielding layer, positioned at a location of a lower surface of the substrate corresponding to the active layer, configured to perform a light shielding for the active layer;
a back insulating layer, positioned at the lower surface of the substrate and covering the metal light shielding layer and the lower surface of the substrate; and
a metal line layer, positioned at a side of the substrate and under the metal light shielding layer, configured to connect to an external driving chip, wherein the metal line layer is positioned at the side of the substrate and a lower surface of the back insulating layer and contacts the metal light shielding layer through a via on the back insulating layer.

8. The TFT backplane of claim 7, wherein a length of the metal light shielding layer is greater than a length of a channel region of the active layer, a width of the metal light shielding layer is wider than a width of the channel region of the active layer, and the channel region of active layer is aligned with a center of the metal light shielding layer.

9. The TFT backplane of claim 7, wherein the metal line layer is manufactured with a transparent conductive material.

10. The TFT backplane of claim 7, wherein the TFT is a top gate oxide TFT.

11. The TFT backplane of claim 7, wherein the TFT is manufactured through a top gate low temperature poly-silicon technique.

12. The TFT backplane of claim 7, wherein the TFT comprises a single-layer source/drain metal layer or a multi-layer source/drain metal layer.

13. The TFT backplane of claim 7, further comprising:
a gate insulating layer and a gate metal layer sequentially positioned at a surface of the active layer, wherein the gate metal layer constitute as a gate of the TFT;
a dielectric layer, covering the substrate, the active layer, the gate insulating layer and the gate metal layer;
a source/drain metal layer, positioned above the dielectric layer, constituting as a source/drain of the TFT, the source/drain of the TFT contacts a source/drain contact region through a via.

14. The TFT backplane of claim 7, further comprising:
a buffer layer, positioned between the active layer and the substrate.

15. A micro-light emitting diode (micro-LED) display, comprising a thin film transistor (TFT) back plane, the TFT back plane comprising:
a substrate;
a buffer layer, positioned above the substrate;
at least one TFT, positioned above the buffer layer, the TFT comprising an active layer;
at least one metal light shielding layer, positioned at a location of a lower surface of the substrate corresponding to the active layer, configured to perform a light shielding for the active layer; and
a back insulating layer, positioned at the lower surface of the substrate and covering the metal light shielding layer and the lower surface of the substrate; and
a metal line layer, positioned at a side of the substrate and under the metal light shielding layer, configured to connect to an external driving chip, wherein the metal line layer is positioned at the side of the substrate and a lower surface of the back insulating layer and contacts the metal light shielding layer through a via on the back insulating layer;
wherein a length of the metal light shielding layer is greater than a length of a channel region of the active layer, a width of the metal light shielding layer is wider than a width of the channel region of the active layer, and the channel region of active layer is aligned with a center of the metal light shielding layer.

16. The display of claim 15, wherein the TFT is manufactured through a top gate low temperature poly-silicon technique.

17. The display of claim 15, wherein the TFT comprises a single-layer source/drain metal layer or a multi-layer source/drain metal layer.

18. The display of claim 15, wherein the TFT back plane further comprises:
a gate insulating layer and a gate metal layer sequentially positioned at a surface of the active layer, wherein the gate metal layer constitute as a gate of the TFT;
a dielectric layer, covering the substrate, the active layer, the gate insulating layer and the gate metal layer;
a source/drain metal layer, positioned above the dielectric layer, constituting as a source/drain of the TFT, the source/drain of the TFT contacts a source/drain contact region through a via.

19. The display of claim 15, wherein the TFT back plane further comprises:
   a buffer layer, positioned between the active layer and the substrate.

* * * * *